(12) United States Patent
Tada et al.

(10) Patent No.: US 7,728,682 B2
(45) Date of Patent: Jun. 1, 2010

(54) MICRO-OSCILLATOR, SEMICONDUCTOR DEVICE AND COMMUNICATION APPARATUS

(75) Inventors: Masahiro Tada, Kanagawa (JP); Koichi Ikeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 357 days.

(21) Appl. No.: 11/331,253

(22) Filed: Jan. 12, 2006

(65) Prior Publication Data
US 2006/0158273 A1 Jul. 20, 2006

(30) Foreign Application Priority Data
Jan. 20, 2005 (JP) ............................ P2005-013302

(51) Int. Cl.
G04C 3/10 (2006.01)
H03B 5/30 (2006.01)
(52) U.S. Cl. .................... 331/116 M; 331/154; 333/200
(58) Field of Classification Search ................. 331/154, 331/116 M; 333/200
See application file for complete search history.

(56) References Cited

U.S. PATENT DOCUMENTS 6,236,281 B1 * 5/2001 Nguyen et al. ............... 331/154
7,463,116 B2 * 12/2008 Naniwada .................... 333/186

* cited by examiner

*Primary Examiner*—Robert Pascal
*Assistant Examiner*—James E Goodley
(74) *Attorney, Agent, or Firm*—Sonnenschein Nath & Rosenthal LLP

(57) ABSTRACT

A micro-oscillator in which the dispersion of center frequency, the interference between adjacent oscillator elements and the like are controlled and the resonance characteristic is excellent, and a semiconductor device including the micro-oscillator as well as a communication apparatus using a band-pass filter including the micro-oscillator, are provided. The micro-oscillator includes: a plurality of beam-type first oscillator elements 33 connected in parallel and a non-resonance beam-type second oscillator element 34 arranged between the first oscillator elements 33 adjacent to each other.

4 Claims, 13 Drawing Sheets

MICRO-OSCILLATOR, SEMICONDUCTOR DEVICE AND COMMUNICATION APPARATUS

CROSS REFERENCES TO RELATED APPLICATIONS

The present invention contains subject matter related to Japanese Patent Application JP 2005-013302 filed in the Japanese Patent Office on Jan. 20, 2005, the entire contents of which being incorporated herein by reference.

BACKGROUND OF THE INVENTION

1. Field of the Invention

The present invention relates to a micro-oscillator to be an element of a signal filter, mixer, resonator and the like, to a semiconductor device that includes the micro-oscillator, and to a communication apparatus in which a band-pass filter including the micro-oscillator is used.

2. Description of the Related Art

A micro-oscillator made by using the MEMS (Micro Electro Mechanical Systems) technology has been known. Since a micro-oscillator made by using semiconductor processes has such advantages as: an area occupied is small; a high Q value can be obtained; and integration with other semiconductor devices is possible, the micro-oscillator is proposed to be used as a high frequency filter within a radio communication device by the research institutes including the University of Michigan (refer to Non-patent Literature 1).

FIG. 1 shows a schematic view of a micro-oscillator, specifically a beam-type oscillator of electrostatic drive, constituting a high frequency filter described above. This oscillation element 1 includes: an input-side wiring layer 7 and an output electrode 4 which are, for example, made of polycrystalline silicon, formed on a semiconductor substrate 2 through an insulation film 3, and an electrode to be a oscillation plate, that is, a beam 6 formed to face the output electrode 4 separated by a space 5. The beam 6 straddles like a bridge to be connected to the input-side wiring layer 7 such that this beam is supported by anchor portions (support portions) 8 [8A, 8B] at the both ends. The beam 6 becomes an input electrode. An input terminal t1 is led out from the input-side wiring layer 7 and an output terminal t2 is led out from the output electrode 4. In this oscillator 1, a high frequency signal S1 is supplied through the input terminal t1 in a state in which a DC bias voltage V1 is applied between the beam 6 and the ground. When the DC bias voltage V1 and high frequency signal S1 are input to the input terminal 1, the beam 6 having a natural oscillation frequency determined by a length thereof oscillates by electrostatic power generated between the output electrode 4 and the beam 6. With this oscillation, a high frequency signal corresponding to temporal change of capacitance between the output electrode 4 and the beam 6 and the DC bias voltage is output from the output electrode 4 (therefore, from the output terminal t2 ). A signal corresponding to the natural oscillation frequency (natural frequency) of the beam 6 is output in a high frequency filter.

Non-patent Literature 1: C. T.-Nguyen, Micromechanical components for miniaturized low-power communications (invited plenary), proceedings, 1999 IEEE MTT-S International Microwave Symposium RF MEMS workshop, Jun. 18, 1999, pp 48-77.

SUMMARY OF THE INVENTION

FIG. 2 shows as related art another constitution of a beam-type oscillator of electrostatic drive. This oscillator 11 includes: an input electrode 14 and an output electrode 15 formed, for example, on a silicon substrate 12 through an insulation film 13, and an electrode, namely a beam 17 to be an oscillator plate formed to face the input electrode 14 and output electrode 15 separated by a space 16. The beam 17 straddles the input and output electrodes 14, 15 like a bridge and is integrally supported by the anchor portions at both ends (support portions) 19 (19A, 19B) to be connected to wiring layers 18 arranged outside the input and output electrodes 14, 15. An input terminal t1 is led out from the input electrode 14 and a high frequency signal S1 is input through the input terminal t1. An output terminal t2 is led out from the output electrode 15. A necessary DC bias voltage V1 is applied to the beam 17.

As for this oscillator 11, the beam 17 oscillates by the electrostatic force generated between the beam 17 to which the DC bias voltage is applied and the input electrode 14 when a high frequency signal Si is supplied to the input electrode 14, and a high frequency signal of the desired frequency is output from the output electrode 15. According to this micro-oscillator 11, because an area where the input electrode 14 and output electrode 15 are facing each other is small and an interval between the input electrode 14 and the output electrode 15 is made large, a parasitic capacity Co between the input and output electrodes 14, 15 becomes small in comparison with the oscillator 1 in FIG. 1. Therefore, the signal that passes directly through the parasitic capacity Co between input and output electrodes 14, 15, namely the noise component, becomes small, and consequently the SN (Signal to Noise) ratio is improved.

On the other hand, with a single oscillator, the impedance is high and so it has not been practical to be used. Accordingly, technology of arranging the oscillators in parallel has been proposed in order to reduce the impedance. FIG. 3 shows an example of the micro-oscillator in which the micro-oscillator elements having the same structure as the one shown in FIG. 1 are arranged in parallel. This micro-oscillator 21 includes: a common output electrode 23 to be a lower electrode formed on a substrate 22 and a plurality of beams 24 that straddle this output electrode 23 like a bridge to function also as input electrodes arranged in parallel along the longitudinal direction of the output electrode 23 and so a plurality of oscillator elements 25 are electrically connected in parallel. The output electrode 23 is divided into two output electrodes 231, 232. A plurality of beams 241 and a plurality of beams 242 are arranged respectively in parallel in the horizontal direction in the figure to straddle those divided output electrodes 231, 232 and to be supported by anchor portions on wiring layers 26 (261, 262, 263). The beams 241 and 242 that are arranged in the vertical direction in the figure are electrically connected through the wiring layer 262, respectively. Each beam 24 (241, 242) is connected in common through wiring layers 261 and 263, respectively. A plurality of oscillator elements 25 (from 251A to 251F, from 252A to 252F) connected in parallel are formed with the output electrodes 231, 232 and beam 241, 242 respectively corresponding thereto.

However, in the case in which the oscillator elements are arranged in parallel in order to reduce the impedance, the dispersion of center frequency of each oscillator element largely affects the characteristic.

Further, in the case in which these are arranged in parallel, there is a high possibility of influence on the characteristics due to the mutual interference between the adjacent oscillator elements.

As the mutual interference between the oscillator elements, there are the interference caused by the mechanical oscillation and the interference caused by the electrical interference. When the oscillator-group resonates, elastic waves generated from a plurality of oscillation sources spread in the substrate and this substrate oscillation excites oscillator elements to consequently cause the interference of mechanical oscillation.

The present invention addresses the above described points, and provides a micro-oscillator in which dispersion of center frequency, interference between adjacent oscillator elements and the like are reduced and the resonance characteristic is excellent, a semiconductor device that includes this micro-oscillator, and a communication apparatus including a band-pass filter having this micro-oscillator.

A micro-oscillator according to an embodiment of the present invention includes: a plurality of beam-type first oscillator elements connected in parallel, and a non-resonance beam-type second oscillator element arranged between the first oscillator elements adjacent to each other.

It is preferable that a ground potential is applied to the beam of the non-resonance second oscillator element.

It is preferable that the beam of the non-resonance second oscillator element is in a floating condition in terms of the potential.

A micro-oscillator according to an embodiment of the present invention includes: a plurality of beam-type first oscillator elements connected mutually in parallel and a plurality of beam-type second oscillator elements connected mutually in parallel, in which each of the first oscillator elements and each of the second oscillator elements are alternately arranged, and a DC bias voltage applied to each beam of the first and second oscillator elements is individually controlled.

A micro-oscillator according to an embodiment of the present invention includes: a plurality of oscillator-groups arranged in which a plurality of beam-type oscillator elements are connected in parallel and non-resonance beam-type oscillator elements arranged between the above oscillator elements in the oscillator-group adjacent, wherein at least a different DC bias voltage is applied to the oscillator-groups.

In a micro-oscillator according to an embodiment of the present invention, it is preferable that the first oscillator elements adjacent to each other in the direction different from that of arranging the first and second oscillator elements are arranged such that phases of the oscillation become reverse to each other.

In a micro-oscillator according to an embodiment of the present invention, it is preferable that the first oscillator elements adjacent to each other and the second oscillator elements adjacent to each other in the direction different from that of arranging the first and second oscillator elements are arranged such that phases of the oscillation become reverse to each other, respectively.

In a micro-oscillator according to an embodiment of the present invention, it is preferable that in each oscillator-group the oscillator elements adjacent to each other in the direction different from that of arranging the non-resonance oscillator elements are arranged such that phases of the oscillation become reverse to each other.

A semiconductor device according to an embodiment of the present invention includes the above described micro-oscillator.

A communication apparatus according to an embodiment of the present invention is the communication apparatus that includes a filter performing the bandwidth limitation to a transmission signal and/or reception signal, in which a filter having the above described micro-oscillator is used as the filter.

According to the micro-oscillator of the present invention, since a plurality of beam-type first oscillator elements are connected in parallel, the impedance of the micro-oscillator is reduced and various devices can be commercialized. Further, since the non-resonance second oscillator element is arranged between the first oscillator elements adjacent to each other, the non-resonance second oscillator element functions as a dumper for the mechanical oscillation or as an electrical shield and the mutual interference between the oscillator elements in the micro-oscillators arranged in parallel can be reduced. Furthermore, a sub-peak that occurs in a frequency area off the center frequency can be lowered and the dispersion of the frequency can be reduced. Therefore, the micro-oscillator that has the excellent resonance characteristic can be provided.

Particularly, by applying a ground potential to the beam of the non-resonance second oscillator element, as for the electrical interference that is one of the causes of interference between the oscillator elements in the micro-oscillators arranged in parallel, the second oscillator element functions as the shield and the electrical interference can be reduced. Hence, the sub-peak is lowered to make the Q value high. Further, as for the interference by the mechanical oscillation that is another cause of the interference between the oscillator elements, the interference can be reduced, because the second non-resonance oscillation element functions as the dumper. In other words, a ground level is made low by trapping the noise component (outside and power source), electrically. Mechanically, the oscillation by the electrostatic force except for the desired oscillation mode can be reduced by employing a constitution that includes the oscillator.

By making the beam of the non-resonance second oscillator element be in the floating condition in terms of the potential, the non-resonance second oscillator element functions as the dumper to reduce the interference.

Since a plurality of first oscillator elements connected in parallel and a plurality of second oscillator elements connected in parallel are included and each of the first oscillator elements, second oscillator elements are arranged alternately and a DC bias voltage applied to each beam of the first and second oscillator elements is controlled individually, the resonance with different resonance frequency can be generated and the Q value of the resonance characteristic can be controlled. In other words, the resonance characteristic can be changed by interfering with each other.

Since a plurality of oscillator-groups in which a plurality of beam-type oscillator elements are connected in parallel are arranged and a non-resonance oscillator element is arranged between the oscillator elements adjacent to each other in the oscillator-group, and oscillator-groups in which at least a DC bias voltage applied is different are included, the resonance characteristic can be variable, in other words, can be controlled. In the case in which two of the first and second oscillator-groups are arranged, for example, with the same frequency signal being input to the first and second oscillator-groups and different DC bias voltages being applied thereto respectively, the resonance characteristic of the first oscillator-group can be controlled by the second oscillator-group, for example. Since the non-resonance oscillator element is arranged, the mutual interference between adjacent oscillator elements in each oscillator-group can be reduced.

By arranging first oscillator elements adjacent to each other in the direction different from the direction of arranging the first oscillator elements and non-resonance second oscillator elements such that phases of the oscillation become reverse to each other, the oscillations affecting the substrate are offset and the cause of substrate oscillation can be reduced.

In the above described micro-oscillator in which an individual DC bias voltage is applied to the first and second oscillator elements, also, by arranging the first oscillator elements and second oscillator elements respectively adjacent to each other in the direction different from the direction of both the arranged oscillator elements such that phases of the oscillation become reverse to each other, the oscillations affecting the substrate are offset and the cause of substrate oscillation can be reduced.

In the above described micro-oscillator in which a plurality of oscillator-groups and non-resonance oscillator elements are arranged, also, by arranging the oscillator elements adjacent to each other in the direction different from the direction of arranging the non-resonance oscillator elements in each oscillator-group such that phases of the oscillation become reverse to each other, the oscillations affecting the substrate are offset and the cause of substrate oscillation can be reduced.

According to the semiconductor device of the present invention, by using the micro-oscillator of the present invention described above as an oscillator constituting the semiconductor device, the semiconductor device in which the mutual interference between the oscillator elements is reduced and which has an excellent characteristic can be provided.

According to the communication apparatus of the present invention, by using a filter having the micro-oscillator of the present invention as a band-pass filter, the mutual interference between the oscillator elements is reduced, the excellent filter characteristic is obtained and the communication apparatus with high reliability can be provided.

BRIEF DESCRIPTION OF THE DRAWINGS

These and other objects and features of the present invention will become clear from the following description of the preferred embodiments given with reference to the accompanying drawings, in which.

DESCRIPTION OF THE PREFERRED EMBODIMENTS

Hereinafter, embodiments of the present invention are explained with reference to the drawings.

Figure 1:
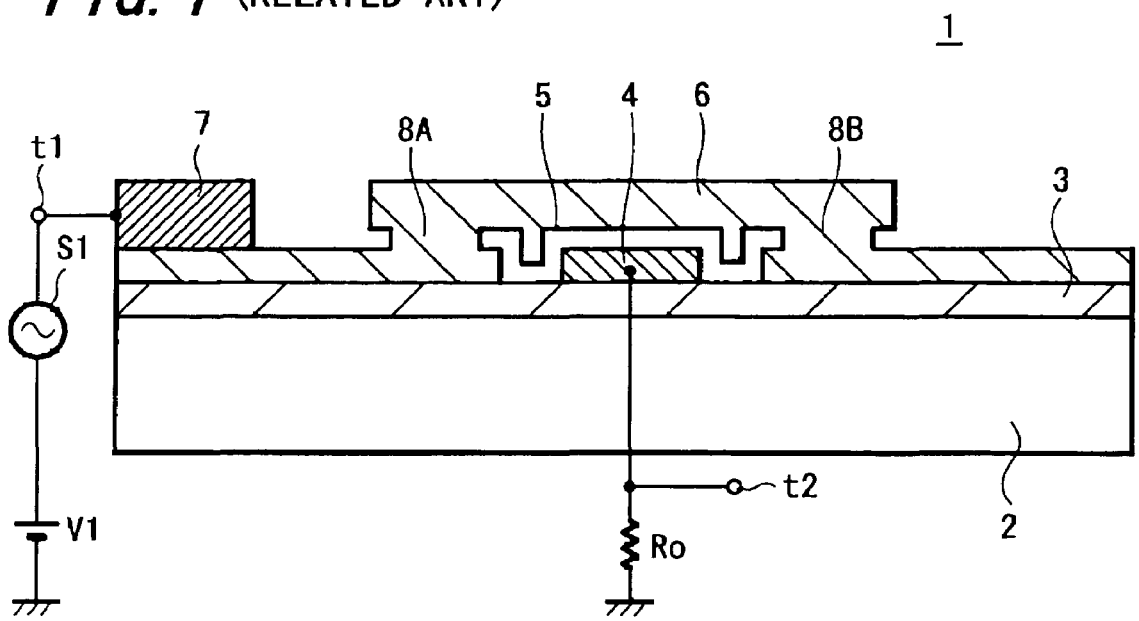
FIG. 1 is a schematic view of a beam-type oscillator of electrostatic drive in the past.
Figure 4:
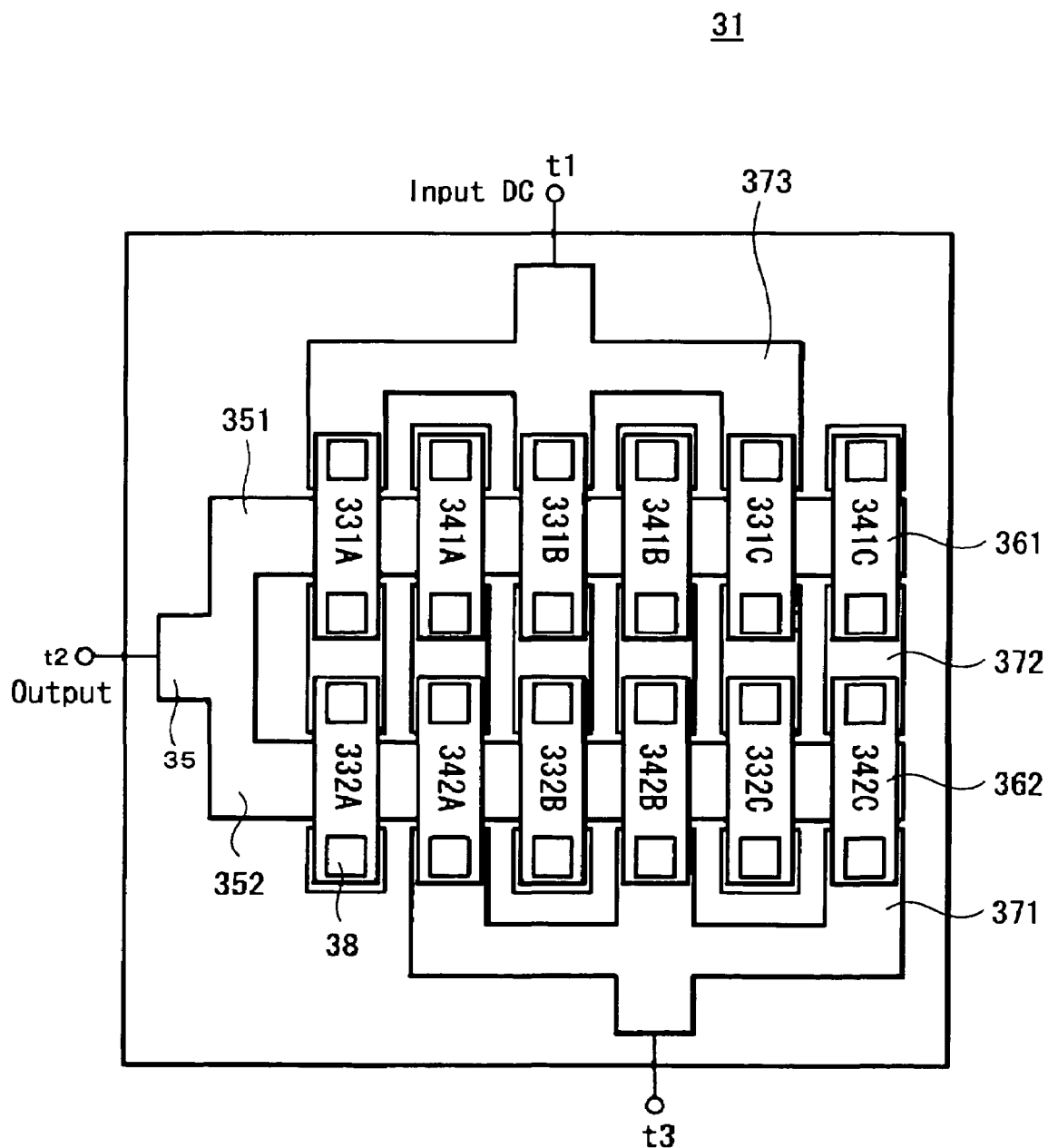
FIG. 4 is a schematic constitutional diagram showing a first embodiment of a micro-oscillator according to the present invention.

FIG. 4 shows the first embodiment of the micro-oscillator according to the present invention. In the first embodiment, the oscillator element having the same structure as the one shown in FIG. 1 is used. A micro-oscillator 31 according to this embodiment includes: a plurality of first oscillator elements 33 (331A to 331C, 332A to 332C) arranged in parallel on a common substrate 32, and a plurality of second oscillator elements 34 (341A to 341C, 342A to 342C) arranged in parallel to be inserted between first oscillator elements 33 that are adjacent to each other.

Specifically, the first oscillator elements 33 (331A to 331C, 332A to 332C) are formed such that: an output electrode 35 to be a lower electrode is divided in two and formed on the surface of a substrate 32, and a plurality of beams 36 (361, 362) to be independent oscillation plates are arranged on two branched parallel output electrodes 351, 352, respectively separated by a space. Respective beams 361, 362 are arranged in parallel in the horizontal direction in the figure to be supported by anchor portions (support portions) 38 on wiring layers 371, 372, 373. The adjacent beams 361 and 362 arranged in the vertical direction in the figure are electrically connected through the wiring layer 372, respectively. The wiring layer 373 connected to the other end of each beam 361 is connected in common and therefore an input terminal t1 to which an input signal and a DC (Direct-Current) bias voltage are supplied is led out from the layer. An output terminal t2 is led out from the output electrode 35. Thus, the first oscillator elements 331A to 331C, 332A to 332C are connected mutually in parallel.

On the other hand, the non-resonance second oscillator elements 34 (341A to 341C, 342A to 342C) are formed such that: each of the oscillator elements (341A, 342A), (341B, 342B), (341C, 342C) is alternately arranged with the first oscillator elements (331A, 332A), (331B, 332B), (331C, 332C). Specifically, each second oscillator element 34 is inserted between the adjacent first oscillator elements 33. With respect to the second oscillator elements 33 (331A to 331C, 332A to 332C), a plurality of beams 36 (363, 364) to be independent oscillation plates are alternately arranged with the beams 36 (361, 362) of the first oscillator elements 33, on the two branched output electrodes 351, 352 described above, respectively separated by a space. Although the shape and size of the beams 363, 364 may be different from those of the beams 361, 362 of the first oscillator elements 33, it may be desirable to have the same shape and size when the production and the like are considered. Similarly to the first oscillator elements 33, respective beams 363, 364 are arranged in parallel in the horizontal direction in the figure to be supported by the anchor portions (support portions) 38 on the wiring layers 374, 375, 376. Further, the adjacent beams 363, 364 arranged in the vertical direction in the figure are electrically connected through the wiring layer 375, respectively. The wiring layer 374 connected to the beams 342A to 342C is connected in common and a terminal t3 is led out. Thus, the second oscillator elements 341A to 341C, 342A to 342C are connected mutually in parallel.

In this micro-oscillator 31, the first oscillator elements 33 (331A to 331C, 332A to 332C) are driven as the main oscillator, and a DC bias voltage (DC1) is supplied to the beams 363, 364 from the t1, an input signal (frequency signal) superimposed on the DC bias voltage is input, and the desired frequency is output from the output terminal t2. On the other hand, with respect to the non-resonance second oscillator elements 34 that do not resonate, the beams 363, 364 are made to be in the floating condition in terms of the potential (DC2=open) or a ground (GND) potential (DC2=GND) is applied through the terminal t1.

Further, in another practice example of this micro-oscillator 31, different DC bias voltages DC1, DC2 are applied to the terminal t1 of the first oscillator elements 33 and the terminal t3 of the second oscillator elements 34, respectively.

According to the micro-oscillator 31 of the first embodiment, since the non-resonance second oscillator elements (341A, 342A), (341B, 342B), (341C, 342C) are arranged between adjacent oscillator elements (331A, 332A) and (331B, 332B), (331B, 332B) and (331C, 332C), and outside the oscillator elements (331C, 332C), respectively, regarding the first oscillator elements 33 to be the main oscillator, these second oscillator elements 34 perform a function of the mechanical dumper and a function of the electrical shield and so the mutual interference between first oscillator elements 33 can be reduced.

In the case where, for example, the beams 363, 364 of the non-resonance second oscillator elements 34 are in the floating condition in terms of the potential (DC2=open), against the interference due to the mechanical oscillation that is one of the mutual interferences of the oscillation elements in the first oscillator elements 33 (namely, parallel resonator), the second oscillator elements 34 of the non-resonance pattern perform the function of the dumper, and consequently the interference is reduced.

Further, in the case where the ground potential (DC2=GND) was supplied to the beams 363, 364 of the non-resonance second oscillator elements 34, against the electrical interference, the second oscillator elements 34 perform the function of the shield, and consequently the electrical interference can be reduced. In this case, the second oscillator elements 34 can also reduce the interference caused by the mechanical oscillation.

On the other hand, a necessary DC bias voltage (DC2) is applied to the beams 363, 364 of the second oscillator elements 34 and the second oscillator elements 34 are also made to resonate and the micro-oscillator 31 can be driven. Specifically, since the resonance with resonance frequency different from that of the first oscillator elements 33 can be caused for the second oscillator elements 34, it is obvious in the following description that the Q value in the resonance characteristic of the micro-oscillator 31 can be controlled.

Figure 2:
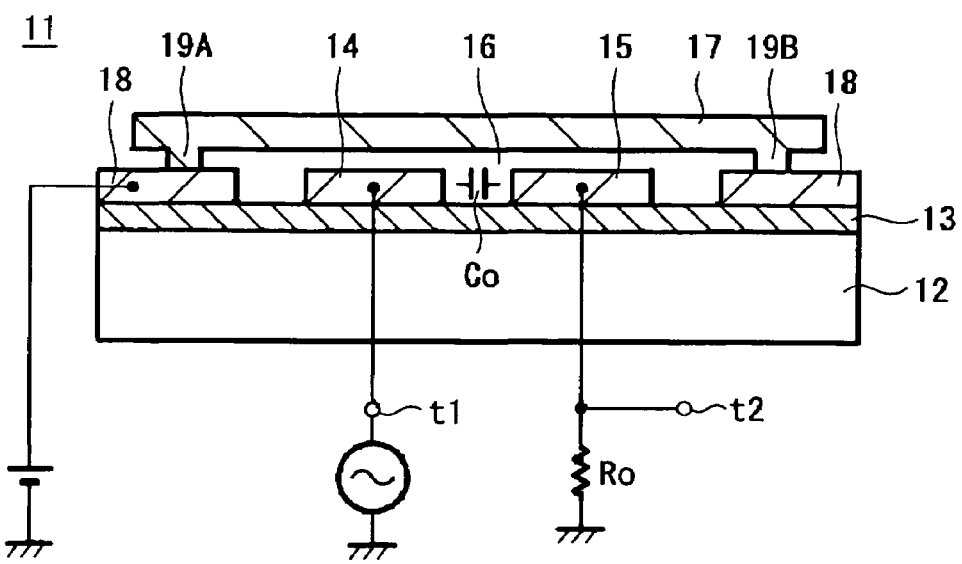
FIG. 2 is a schematic view of a beam-type oscillator of the electrostatic drive in related art.
Figure 3:
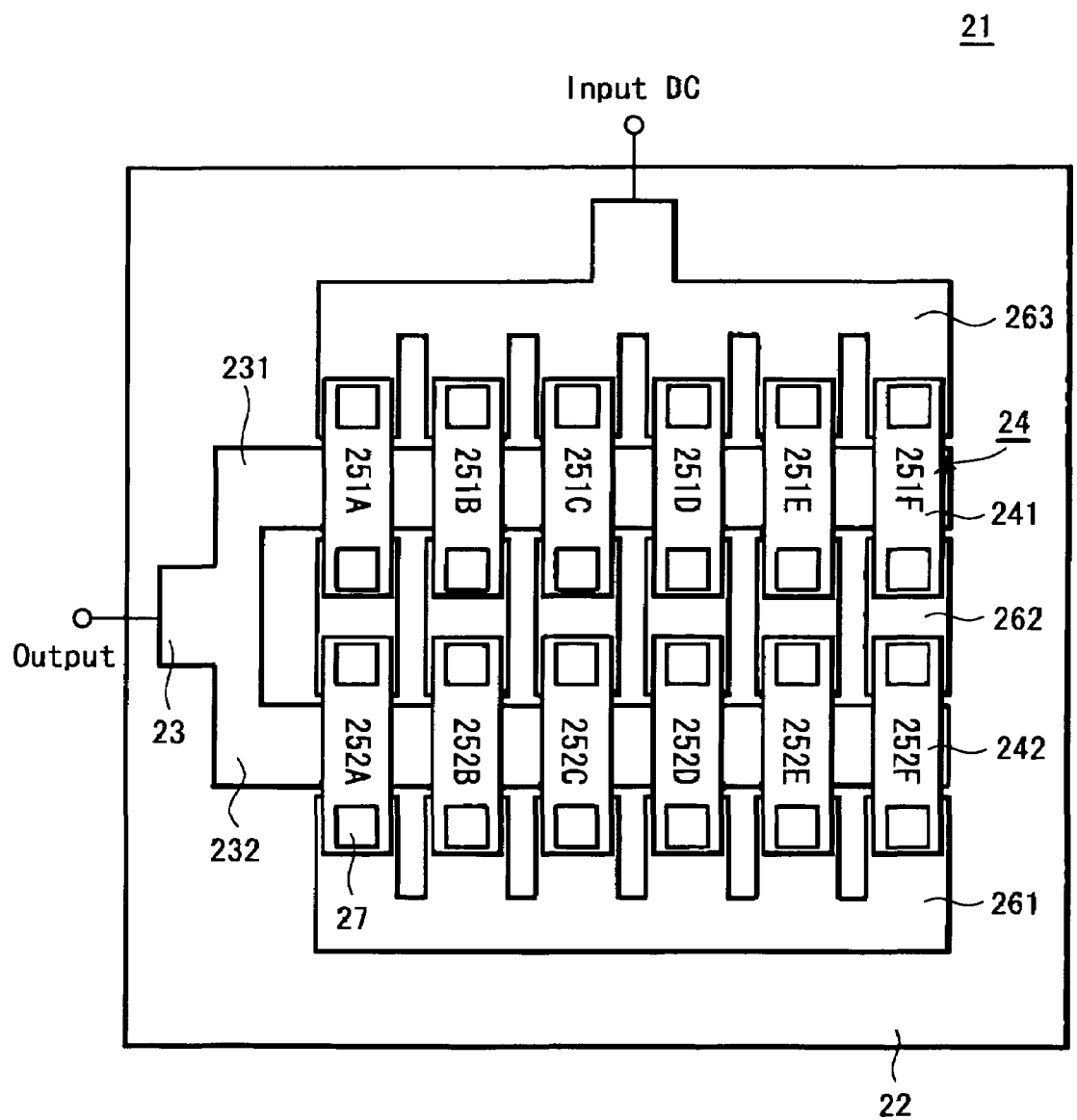
FIG. 3 is a schematic constitutional diagram of a micro-oscillator according to a comparative example.
Figure 5:
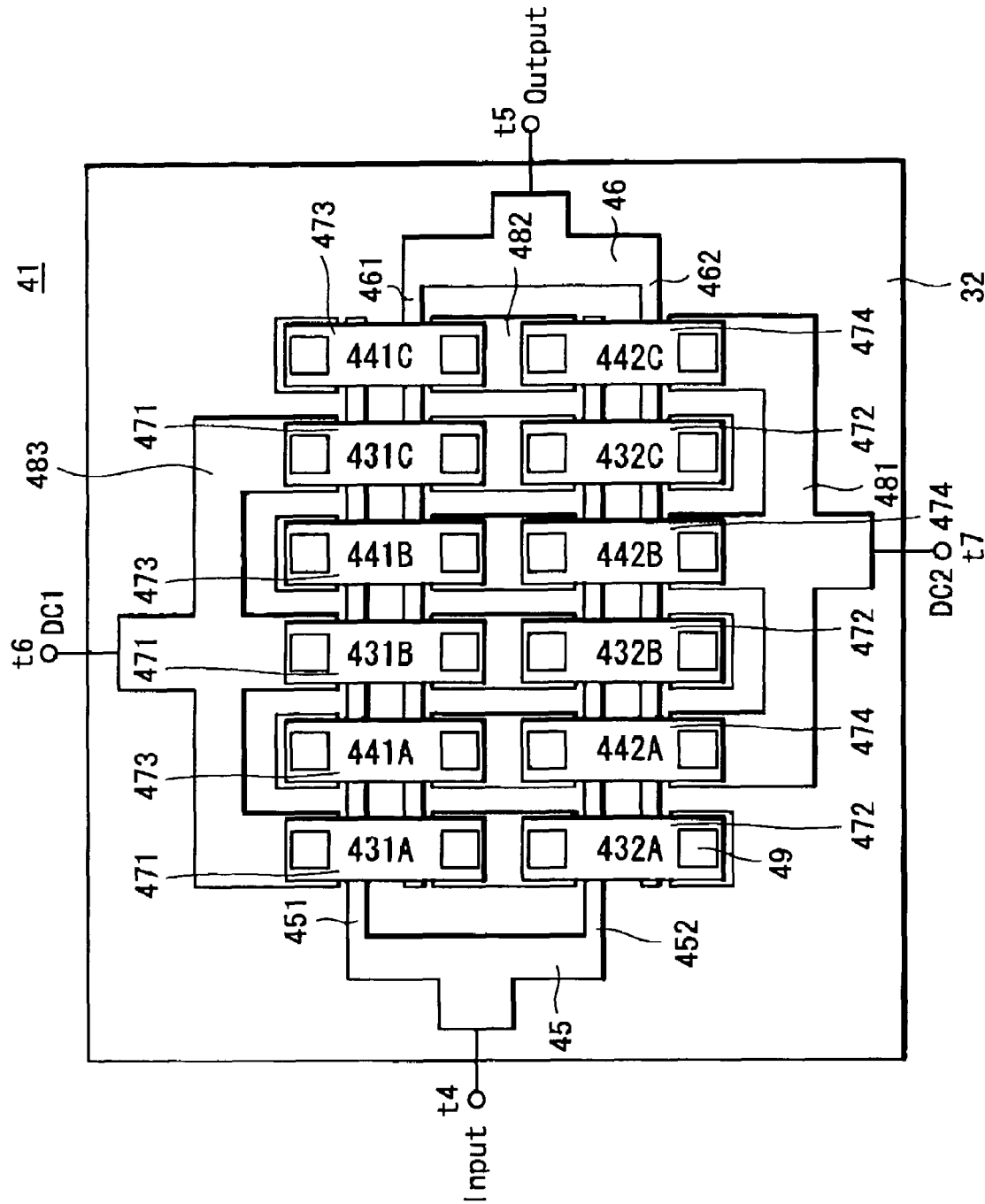
FIG. 5 is a schematic constitutional diagram showing a second embodiment of a micro-oscillator according to the present invention.

Next, FIG. 5 shows the second embodiment of the micro-oscillator according to the present invention. In the second embodiment, the oscillator element having the same structure as the one shown in FIG. 2 is used. A micro-oscillator 41 according to an embodiment includes: a plurality of first oscillator elements 43 (431A to 431C, 432A to 432C) having the beam structure arranged in parallel on a common substrate 32, and a plurality of non-resonance second oscillator elements 44 (441A to 441C, 442A to 442C) arranged in parallel to be inserted between first oscillator elements 43 that are adjacent to each other.

Specifically, the first oscillator elements 43 (431A to 431C, 432A to 432C) are formed such that: an input electrode 45 and output electrode 46 to be the lower electrodes are each divided in two and are formed on the same surface of a substrate 32, and beams 47 (471, 472) are formed to be independent oscillation plates each separated by a space, facing the input/output electrodes 451, 461 and input/output electrodes 452, 462 that are pairs made by branching. In this case, input electrodes 451, 452 and output electrodes 461, 462 branched are formed to be alternately arranged.

Each of the beams 471, 472 is arranged in parallel in the horizontal direction in the figure to be supported by anchor portions (support portions) 49 on wiring layers 481, 482, 483. The adjacent beams 471 and 472 arranged in the vertical direction in the figure are electrically connected through the wiring layer 482, respectively. An input terminal t4 is led out from the input electrode 45, and an output terminal t5 is led out from the output electrode 46. Further, the wiring layer 483 connected to each beam 47 of the oscillator elements 43 is connected in common and a terminal t6 to which a DC bias voltage is supplied is led out. Thus, first oscillator elements 431A to 431C, 432A to 432C are connected mutually in parallel.

On the other hand, the non-resonance second oscillator elements 44 (441A to 441C, 442A to 442C) are formed such that: each pair of the oscillator elements (441A, 442A), (441B, 442B), (441C, 442C) are alternately arranged with the first oscillator elements (431A, 432A), (431B, 432B), (431C, 432C). Specifically, each second oscillator element 44 is inserted between the adjacent first oscillator elements 43. With respect to the second oscillator elements 44 (441A to 441C, 442A-to 442C), the beams 47 (473, 474) to be the independent oscillation plates each separated by a space are alternately arranged with the beams 47 (471, 472) of the first oscillator element 43, on the input/output electrodes 451, 461 and input/output electrode 452, 462 of the pairs branched, as described above.

Although the shape and size of the beams 473, 474 may be different from those of the beams 471, 472 of the first oscillator elements 43, it may be desirable to be the same shape and size as those of the first oscillator elements 43 when the production and the like are considered. Similarly to the first oscillator elements 43, each of the beams 473, 474 is arranged in the horizontal direction in the figure to be supported by the anchor portions (support portions) 49 on the wiring layers 481, 482, 483. The adjacent beams 473, 474 arranged in the vertical direction in the figure are electrically connected through the wiring layer 482, respectively. Further, the wiring layer 481 connected to each beam 47 of the second oscillator elements 44 is connected in common, and a terminal t7 is led out. Thus, second oscillator elements 441A to 441C, 442A to 442C are connected mutually in parallel.

In this micro-oscillator 41, the first oscillator elements 43 (431A to 431C, 432A to 432C) are driven as the main oscillator, and a necessary DC bias voltage is supplied to the beams 471, 472 from the t6, an input signal (frequency signal) is input from the terminal t4, and the desired frequency is output from the output terminal t5. On the other hand, with respect to the non-resonance second oscillator elements 44, the beams 473, 474 are made to be in the floating condition in terms of the potential (DC2=open) or a ground (GND) potential (DC2=GND) is applied through the terminal t7.

Further, as another practice example of this micro-oscillator 41, different DC bias voltages DC1, DC2 are applied to the terminal t6 of the first oscillator elements 43 and to the terminal t7 of the second oscillator elements 44, respectively.

According to the micro-oscillator 41 of the second embodiment, similarly to the first embodiment, since the non-resonance second oscillator elements (441A, 442A), (441B, 442B), (441C, 442C) are arranged between adjacent oscillator elements (431A, 432A) and (431B, 432B), between (431B, 432B) and (431C, 432C), and outside the oscillator elements (431C, 432C), respectively, regarding the first oscillator elements 43 to be the main oscillator, these second oscillator elements 44 perform a function of the mechanical dumper and a function of the electrical shield and so the mutual interference between first oscillator elements 43 can be reduced.

In the case where, for example, the beams 473, 474 of the non-resonance second oscillator elements 44 are in the floating condition in terms of the potential (DC2=open), against the interference due to the mechanical oscillation that is one of the mutual interferences of the oscillation elements in the first oscillator elements 43 (namely, parallel resonator), the second oscillator elements 44 of the non-resonance pattern perform the function of the dumper, and consequently the interference is reduced.

Further, in the case where the ground potential (DC2=GND) was supplied to the beams 473, 474 of the non-resonance second oscillator elements 44, against the electrical interference, the second oscillator elements 44 perform the function of the shield, and consequently the electrical interference can be reduced. In this case, the second oscillator elements 44 can also reduce the interference caused by the mechanical oscillation.

On the other hand, a necessary DC bias voltage (DC2)is applied to the beams 473, 474 of the second oscillator elements 44 and the second oscillator elements 44 are also made to resonate and the micro-oscillator 41 can be driven. Specifically, since the resonance with resonance frequency different from that of the first oscillator elements 43 can be caused for the second oscillator elements 44, it is obvious in the following description that the Q value in the resonance characteristic of the micro-oscillator 41 can be controlled.

Figure 6:
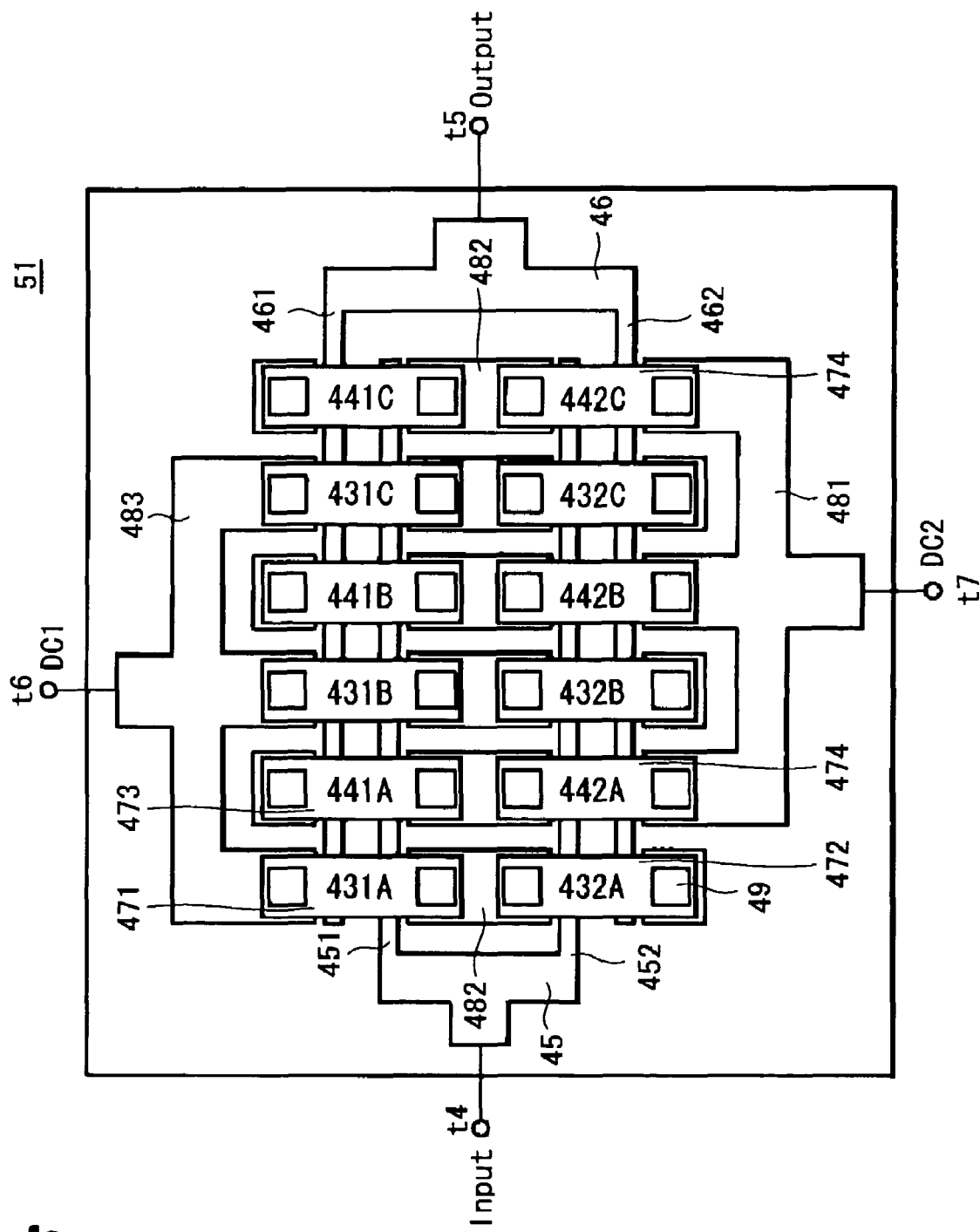
FIG. 6 is a schematic constitutional diagram showing a third embodiment of a micro-oscillator according to the present invention.

Next, FIG. 6 shows the third embodiment of the micro-oscillator according to the present invention. In the third embodiment, the oscillator element having the same structure as the one shown in FIG. 2 is used. Similarly to the second embodiment, a micro-oscillator 51 according to an embodiment includes: a plurality of first oscillator elements 43 (431A to 431C, 432A to 432C) having the beam structure arranged in parallel on a common substrate 32, and a plurality of non-resonance second oscillator elements 44 (441A to 441C, 442A to 442C) arranged in parallel to be inserted between first oscillator elements 43 that are adjacent to each other.

The difference in the structure between the third embodiment and the second embodiment is the arrangement of the input electrode and output electrode that are branched respectively. In other words, in the third embodiment, an input electrode 45 and output electrode 46 to be the lower electrodes are respectively divided in two and are formed on the same surface of the substrate 32, and one of the input electrode 45 and output electrode 46, which are respectively divided, in this embodiment the output electrodes 461, 462 branched, are arranged inside, and the input electrodes 451, 452 branched are arranged outside with the output electrodes in between.

Since the other structure is the same as the micro-oscillator 31 of the second embodiment in FIG. 5, the same numerals are given to the corresponding portions and the redundant explanation is omitted.

According to the micro-oscillator 51 of the third embodiment, since the non-resonance second oscillator elements (441A, 442A), (441B, 442B), (441C, 442C) are arranged between adjacent oscillator elements (431A, 432A) and (431B, 432B), between (431B, 432B) and (431C, 432C), and outside the oscillator elements (431C, 432C), respectively, regarding the first oscillator elements 43 to be the main oscillator, these second oscillator elements 44 perform a function of the mechanical dumper and a function of the electrical shield and so the mutual interference between first oscillator elements 43 can be reduced. Further, the same effectiveness as that explained in the second embodiment is obtained.

Figure 7:
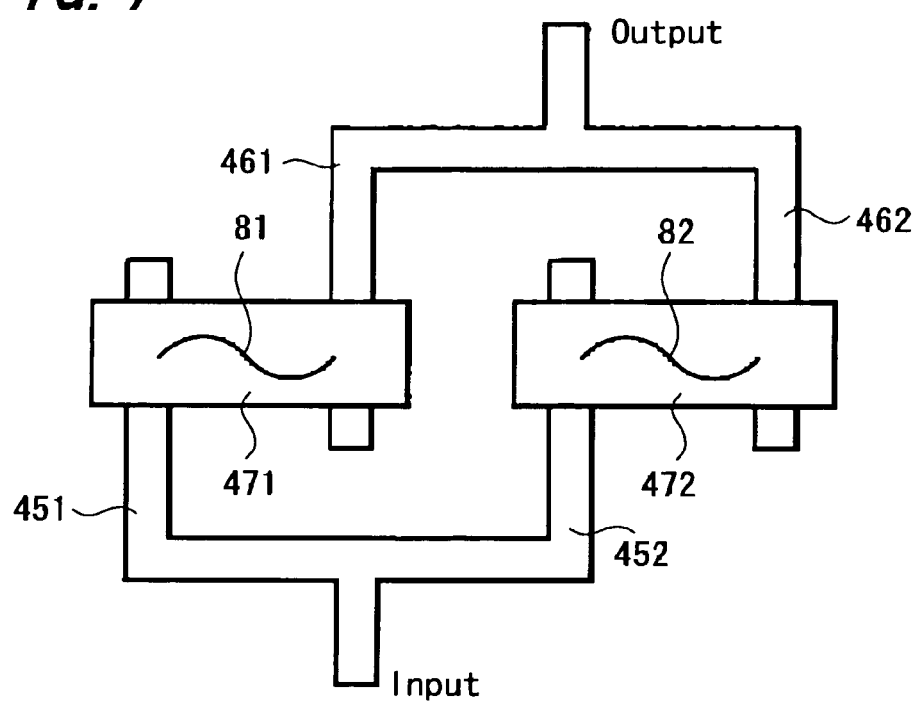
FIG. 7 is an explanatory diagram showing a phase relationship of the oscillation of the micro-oscillator according to the second embodiment of the present invention.
Figure 8:
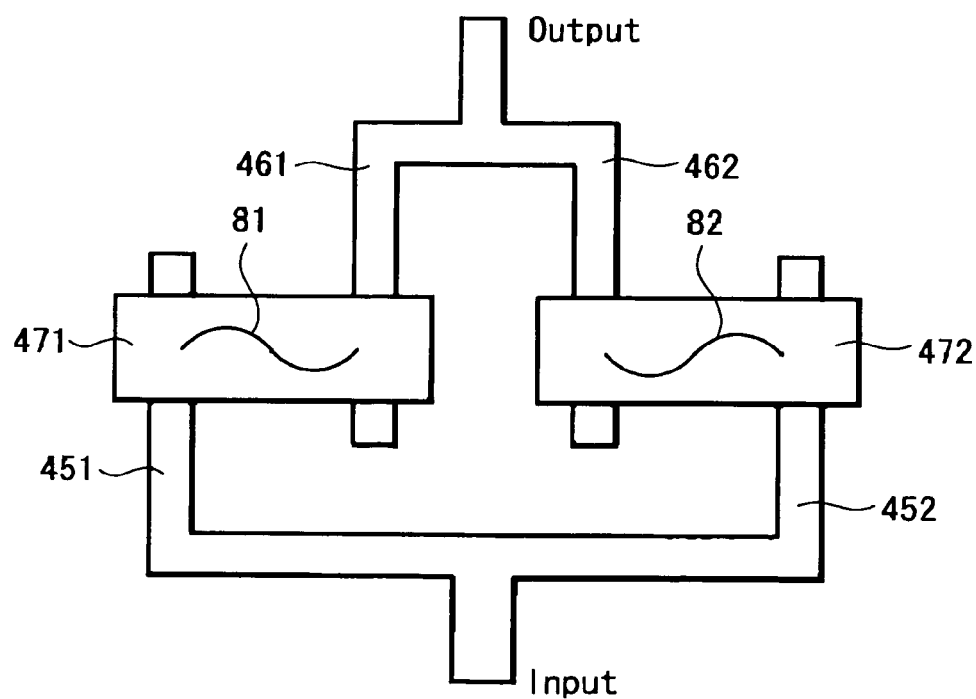
FIG. 8 is an explanatory diagram showing a phase relationship of the oscillation of the micro-oscillator according to the third embodiment of the present invention.

Further, in the micro-oscillator 51 of the third embodiment 51, since phases of oscillation of the adjacent first oscillator elements 431 and 432 in the vertical direction in the figure become reverse to each other, the substrate oscillation caused by the oscillation of the oscillation elements 43 arranged in parallel are offset, and the interference due to the mechanical oscillation is further reduced. Further explanation is made with reference to FIGS. 7 and 8. As shown in a schematic diagram of FIG. 7, in the first oscillator elements 43 according to the second embodiment of FIG. 5, the input electrodes 451, 452 and the output electrodes 351, 352 are alternately arranged, and each of beams 471, 472 is arranged on each pair of the input/output electrodes 451, 462 and the input/output electrodes 452, 462. In this structure, since the oscillations 81, 82 of second mode of the beams 471, 472 become the same phase when the oscillator elements 43 and 44 oscillating simultaneously, the oscillation caused to the substrate (elastic wave) is intensified and is caused easily. On the other hand, as shown in a schematic diagram of FIG. 8, in the first oscillator elements 43 according to the third embodiment of FIG. 6, the output electrodes 461, 462 are arranged inside to be positioned between the input electrodes 451 and 452, and each of beams 471, 472 is arranged on each pair of the input/output electrodes 451, 461 and the input/output electrodes 452, 462. In this structure, since the oscillations 81, 82 of second mode of the beams 471, 472 become the reverse phase when the oscillator elements 43, 44 oscillated simultaneously, the oscillation caused to the substrate (elastic wave) is offset and the substrate oscillation is not caused easily. Thus, the mechanical interference of the oscillator can be reduced furthermore.

Figure 9:
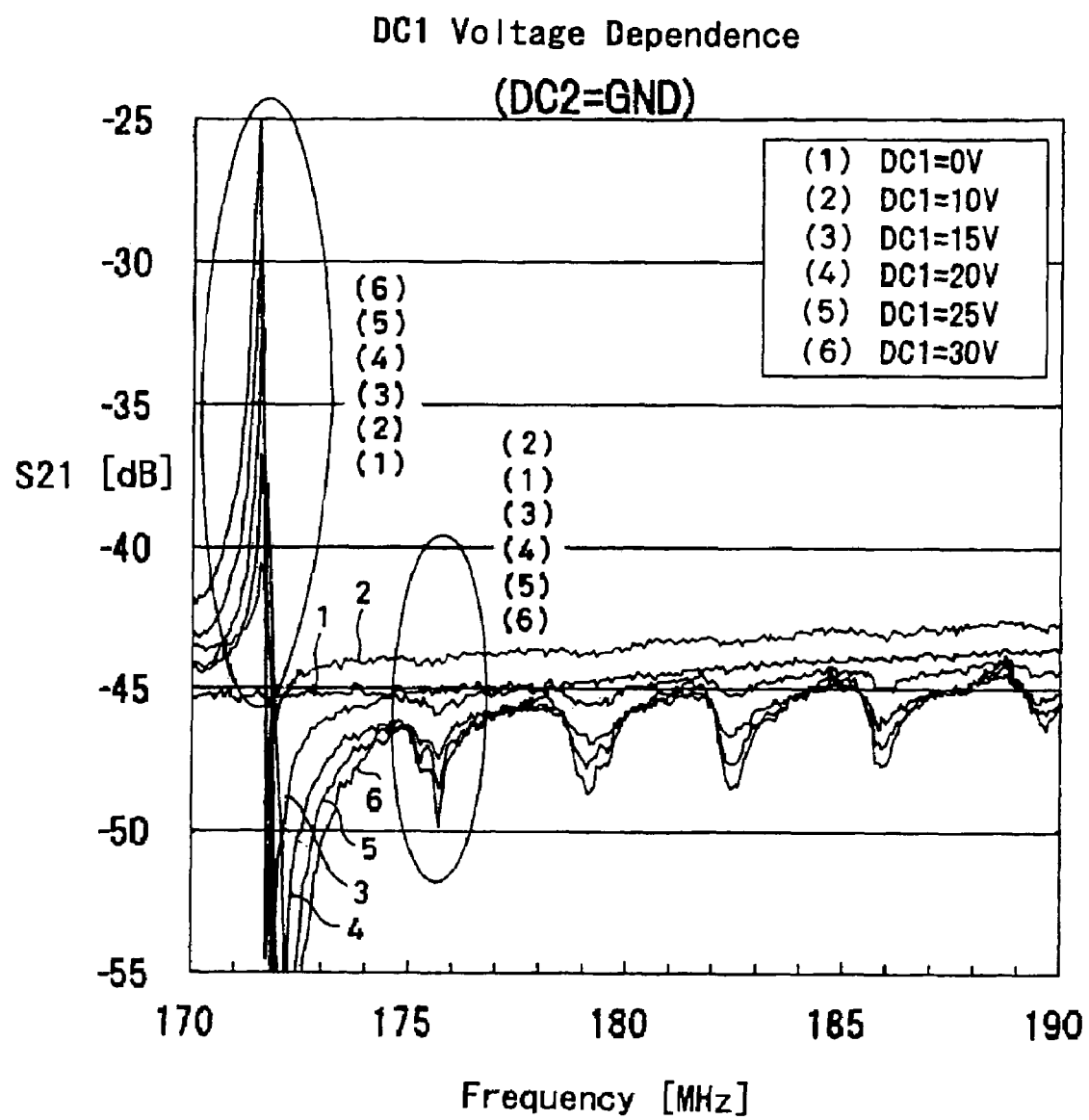
FIG. 9 shows resonance characteristics of the DC1 voltage dependence when a beam voltage DC1 of the first oscillator element is changed in the condition where the micro-oscillator of the third embodiment is used as an example and a beam voltage (DC2) of the second oscillator element is a ground potential (GND)
Figure 10:
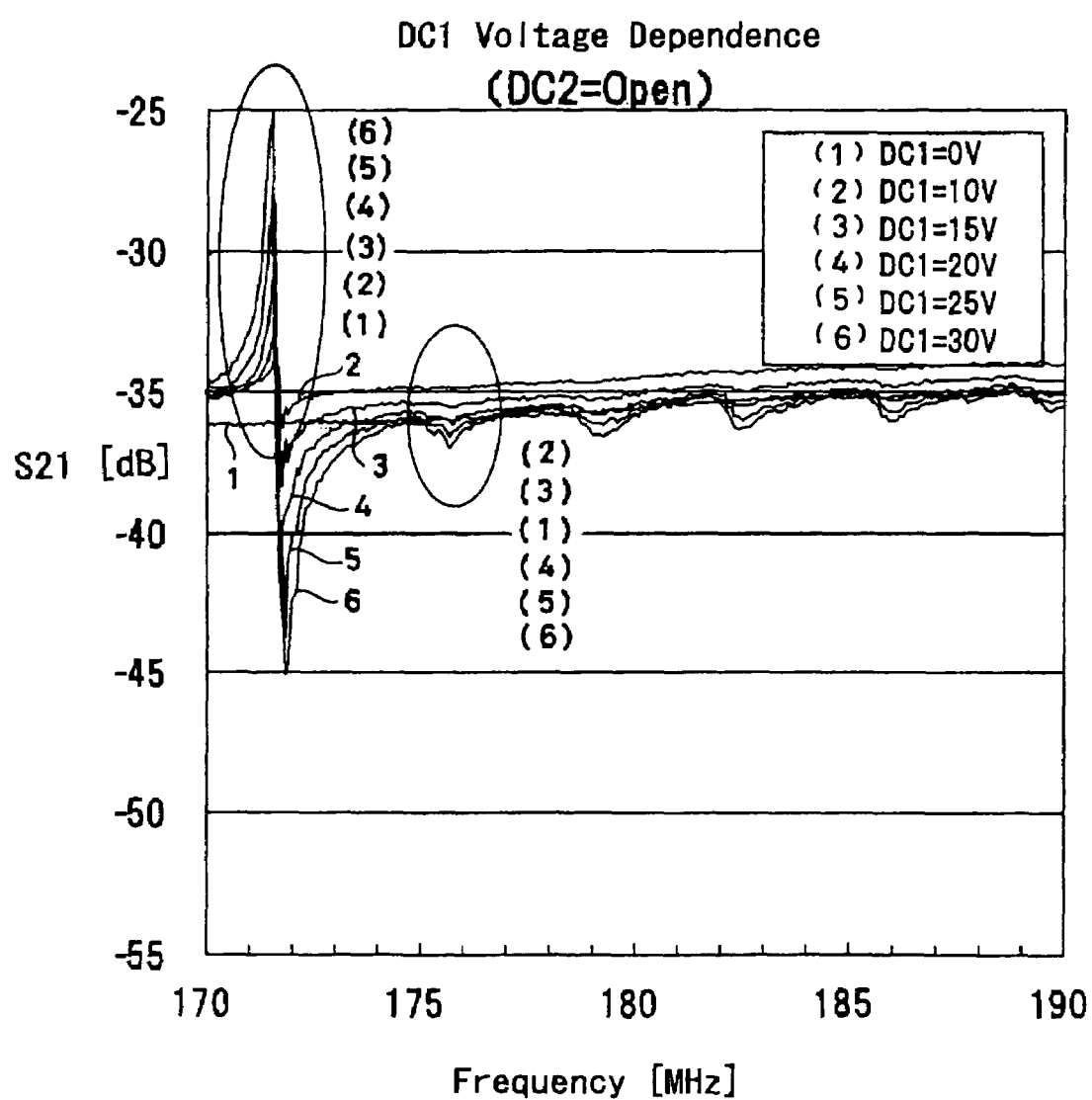
FIG. 10 shows resonance characteristics of the DC1 voltage dependence when a beam voltage DC1 of the first oscillator element is changed in the condition where the micro-oscillator of the third embodiment is used as an example and a beam voltage (DC2) of the second oscillator element is in the open condition.
Figure 11:
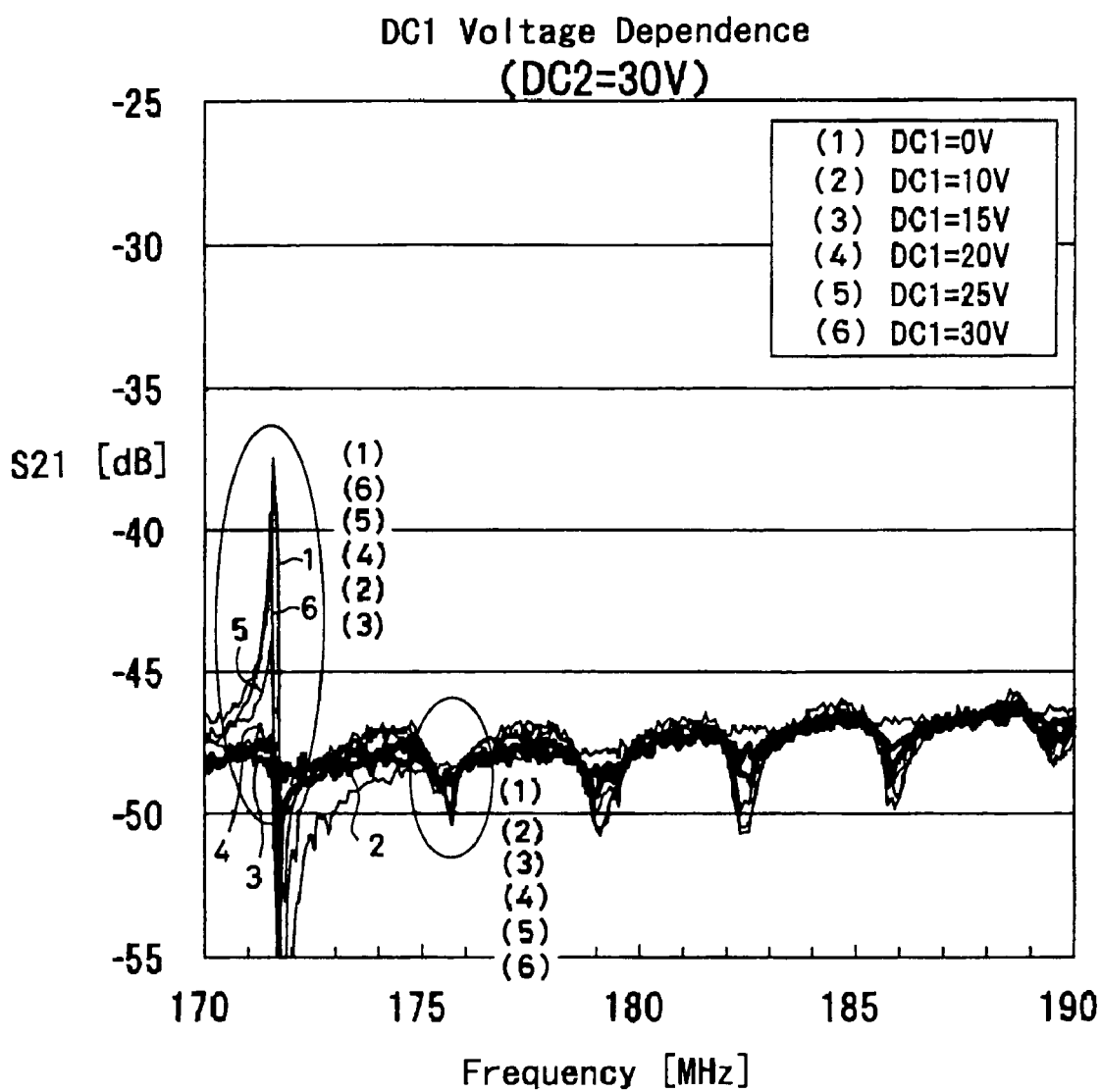
FIG. 11 shows resonance characteristics of the DC1 voltage dependence when a beam voltage DC1 of the first oscillator element is changed in the condition where the micro-oscillator of the third embodiment is used as an example and a beam voltage (DC2) of the second oscillator element is fixed to 30V.

Next, the measurement results with respect to the resonance characteristic of the micro-oscillator according to the embodiment of the present invention are shown in FIGS. 9 to 11. The micro-oscillator 41 in FIG. 5 is used in the measurement.

FIG. 9 shows the DC1 voltage dependence of the resonance characteristic, when a ground voltage (DC bias voltage DC2=GND) is applied to the beams 47 of the non-resonance second oscillator elements 44 through the terminal t7 and the DC bias voltage (DC1) applied to the beams 47 of the first oscillator elements 43 is changed from 0V to 30V. The curves (1), (2), (3), (4), (5) and (6) show the resonance characteristics in which the DC1 voltages are 0V, 10V, 15V, 20V, 25V and 30V, respectively.

According to FIG. 9, it is recognized that by applying the ground voltage (DC2=GND) to the beams 47 of the second oscillator elements 44, the mutual interference between the adjacent first oscillator elements 43 is reduced; the unnecessary resonance in the vicinity of the center frequency disappears; and the peak of resonance (Q value) becomes high.

FIG. 10 shows the DC1 voltage dependence of the resonance characteristic, when the terminal t1 of the beams 47 of the non-resonance second oscillator elements 44 is in the open condition and the potential of the beams is in an electrically floating condition (DC2=open) and a DC bias voltage (DC1) applied to the beams 47 of the first oscillator elements 43 is changed from 0V to 30V. The curves (1), (2), (3), (4), (5) and (6) show the resonance characteristics in which the DC1 voltages are 0V, 10V, 15V, 20V, 25V and 30V, respectively.

According to FIG. 10, in comparison with the resonance characteristic with DC2=GND shown in FIG. 9, the background level "b" increases when the DC2 terminal t7 of the second oscillator elements 44 is open, however, it is recognized that the peak of resonance (Q value) remains almost the same. Thus, the background level can be controlled.

FIG. 11 shows the DC voltage dependence of the resonance characteristic, when DC bias voltage DC2 of a fixed 30V (DC2=30V) is applied to the beams 47 of the second oscillator elements 44 through the terminal t7 and a DC bias voltage (DC1) applied to the beams 47 of the first oscillator elements 43 is changed from 0V to 30V. The curves (1), (2), (3), (4), (5) and (6) show the resonance characteristics in which the DC1 voltages are 0V, 10V, 15V, 20V, 25V and 30V, respectively.

According to FIG. 11, when the DC bias voltage DC2 applied to the beams 47 of the second oscillator elements 44 is fixed to 30V and the DC bias voltage DC1 of the beams 47 of the second oscillator elements 43 is applied, it is recognized that the peak of resonance "a" becomes minimum in the vicinity of 10V to 15V, in comparison with FIG. 9. Thus, the peak of resonance (Q value) can be controlled.

Figure 12:
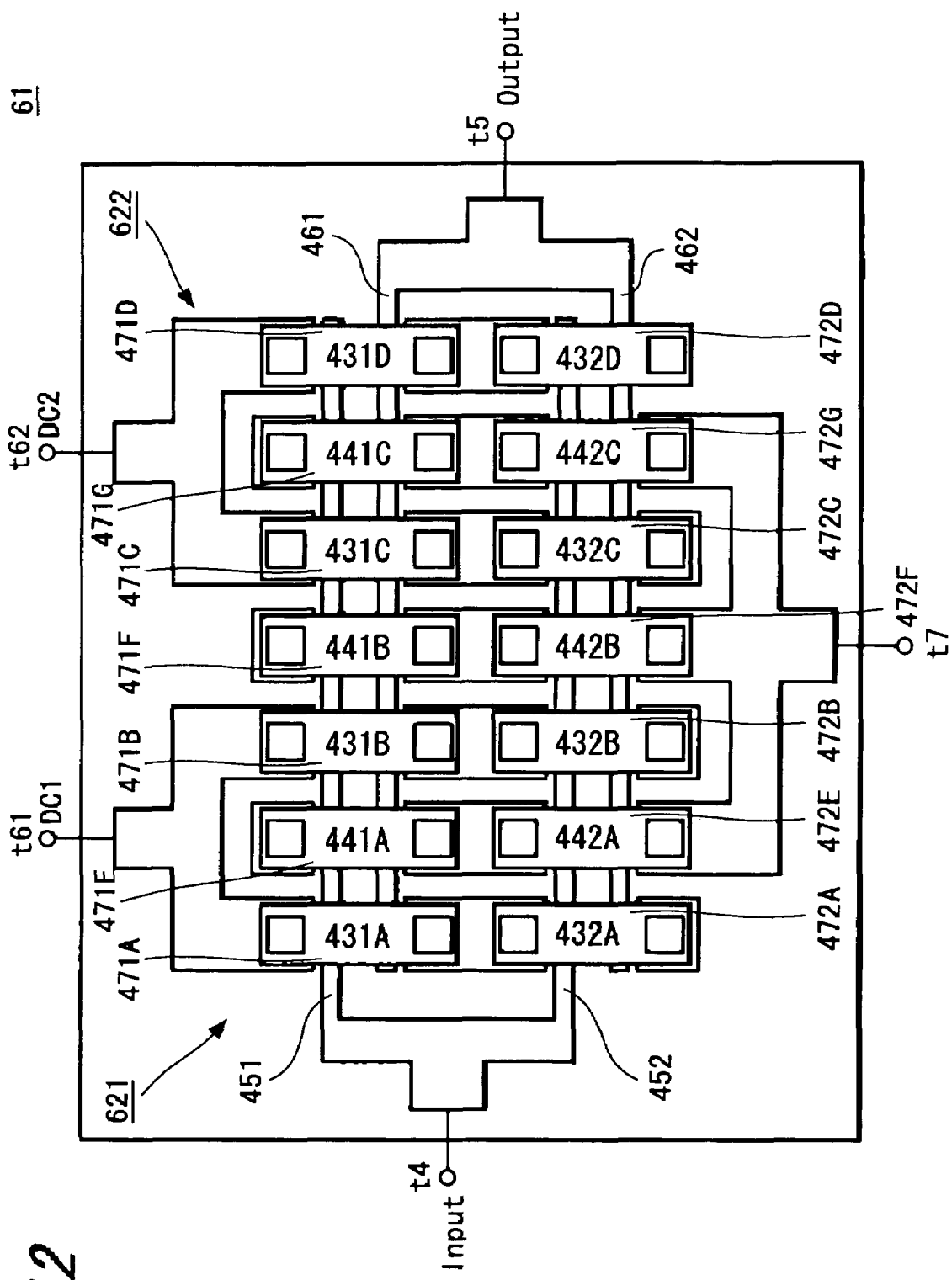
FIG. 12 is a schematic constitutional diagram showing a fourth embodiment of a micro-oscillator according to the present invention.

FIG. 12 shows the fourth embodiment of the micro-oscillator according to the present invention. In the fourth embodiment, the oscillator element having the same structure as that shown in FIG. 2 is used. A micro-oscillator 61 according to this embodiment includes: a plurality of oscillator-groups 62 having a plurality of first oscillator elements 43 including the beam structures arranged on the common substrate 32, that is, the first oscillator-group 621 and the second oscillator-group 622 in this embodiment arranged in parallel, and a plurality of second oscillation elements 44 are arranged in parallel to be inserted between adjacent first oscillator elements 43 in each oscillator-group 62 (621, 622). In this case, the second oscillator elements 44 may be non-resonance oscillator elements, or may be oscillator elements in which a necessary DC bias voltage is applied to beams.

Specifically, the first oscillator-group 621 is formed such that: an input electrode 45 and an output electrode 46 to be the lower electrodes are respectively divided in two and formed on the same surface of a substrate 32, and the beams 47 (471A, 471B, 472A, 472B) to be independent oscillation plates separated by a space are arranged respectively facing the input/output electrodes 451, 461 and input/output electrodes 452, 462 of pairs that are branched, and the first oscillator elements 43 (431A, 431B, 432A, 432B) are formed. The second oscillator-group 622 is formed in parallel with the first oscillator group 621 such that: the beams 47 (471C, 471D, 472C, 472D) to be independent oscillation plates separated by a space are arranged respectively facing the input/output electrodes 451, 461 and input/output electrodes 452, 462 of the same pairs, and the first oscillator elements 43 (431C, 431D, 432C, 432D) are formed.

On the other hand, the second oscillator elements 44 (441A, 442A, 441B, 442B, 441C, 442C) are formed such that: the independent beams 471E, 472E, 471F, 472F, 471G and 472G are arranged, separated by a space, on the same input/output electrodes 451, 461 and input/output electrodes 452, 462 that are branched so that the second oscillator elements 44 are inserted between adjacent first oscillator elements 43 under the condition in which the first and second oscillator-groups 621, 622 are arranged.

Since the other structure is the same as that in FIG. 5, the same numerals are given to the corresponding portions and redundant explanation thereof is omitted.

In the micro-oscillator 61 according to the fourth embodiment, for example, the ground voltage GND is applied to the beams 47 (471E to 472G) of the second oscillator elements 44 through the terminal t7, the same frequency signal is input to the input electrodes 45 (451, 452) of the first and second oscillator-groups 621 and 622, and the DC bias voltage DC1 is applied to the beams 47 (471A to 472B) of the first oscillator-group 621 through the terminal t61, and the DC bias voltage D2 different from the DC1 is applied to the beams 47 (471C to 472G) of the second oscillator-group 622 through the terminal t62.

According to the micro-oscillator 61 of the fourth embodiment, one resonance characteristic of the first oscillator-group 621, for example, can be controlled by the other resonance of the second oscillator-group 622, for example. In the case in which a wide band-pass filter is formed by combining oscillators of different resonance characteristics, the ripple is generated in the wave form of the resonance characteristic, which is not favorable when used. However, with the micro-oscillator 61 of the fourth embodiment, the filter in which no ripple is generated and which has a wide band-pass filter can be formed. Needless to say, since the non-resonance second oscillator elements 44 are arranged between the adjacent first oscillator elements 43, the mutual interference between the first oscillator elements 43 in the oscillator-group 62 can be reduced, as described above. Further, the peak of resonance can be controlled by applying a necessary DC bias voltage to the beams 47 of the second oscillator elements 44.

Next, an example of the method of manufacturing the above described embodiments is explained by referring to FIGS. 13 and 14. FIGS. 13 and 14 representatively show the method of manufacturing the first and second oscillator elements 43 and 44 employed in FIGS. 5, 6 and 12.

Figure 13A:
FIGS. 13A to 13C are production process diagrams (1 of 2) showing an example of a manufacturing method according to an embodiment of the present invention, which is represented by a method of manufacturing an oscillator element.

At first, as shown in FIG. 13A, a silicon oxide film ($SiO_2$) 671 and a silicon nitride film (SiN) 672 are formed on a silicon semiconductor substrate 32 by a decompression CVD method and an insulation film 67 is formed.

Figure 13B:
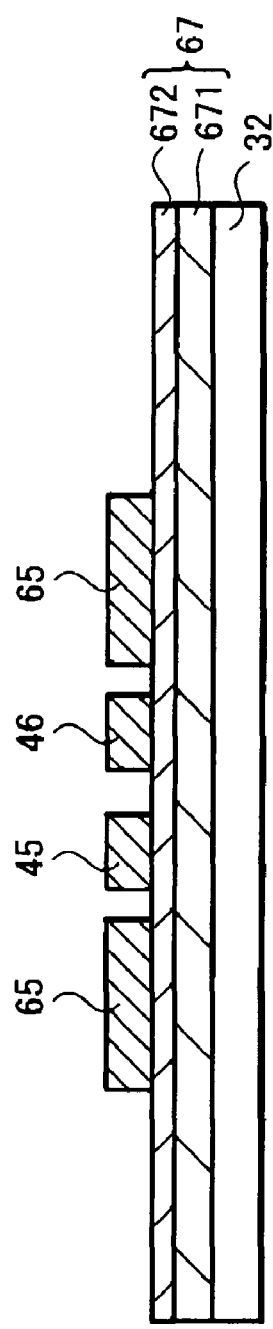

Next, as shown in FIG. 13B, after a polysilicon film that contains phosphor (P), for example, is formed on the insulation film 67, the patterning is applied to the polysilicon film by using lithography technology and dry-etching technology, thereby forming an input electrode 45 the output electrode 46 that become the lower electrodes, and the wiring layers 65 on both sides.

Figure 13C:
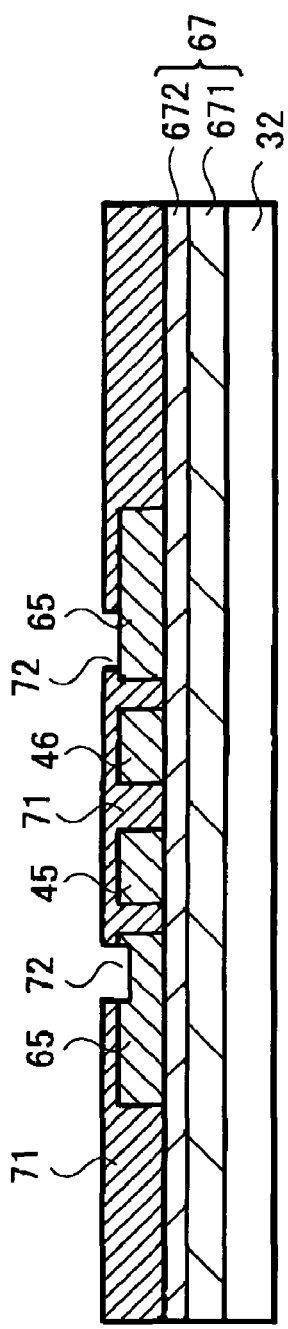

Next, as shown in FIG. 13C, a sacrifice layer 71, a silicon oxide film (SiO2) for example, is formed on the surface that includes the input electrode 45 and the output electrode 46 of the lower electrode and the wiring layers 65, by a decompression CVD method. After that, contact holes 72 are formed in the sacrifice layer 71 at the portions corresponding to the wiring layers 65 by using the lithography technology and dry-etching technology.

Figure 14A:
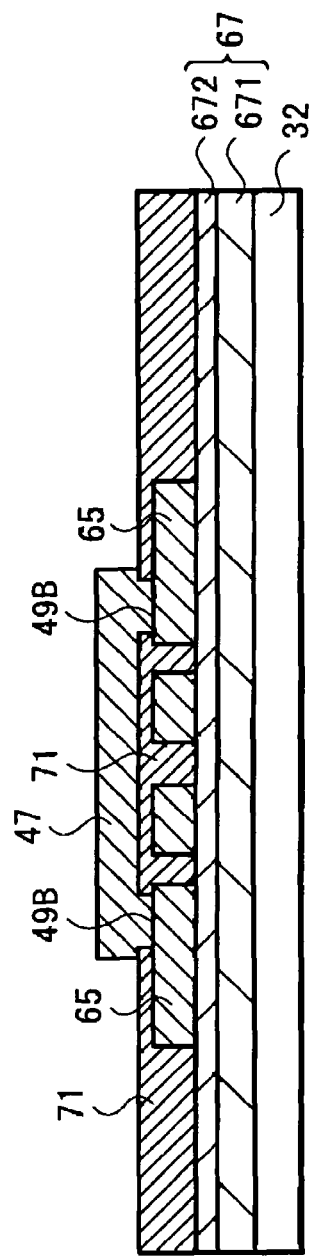
FIGS. 14A to 14C are production process diagrams (2 of 2) showing an example of a manufacturing method according to an embodiment of the present invention, which is represented by a method of manufacturing the oscillator element.

Next, as shown in FIG. 14A, the polysilicon film is formed by the decompression CVD method for example, and patterning is applied to the polysilicon film by using the lithography technology and dry-etching technology, and anchor portions 39A, 39B connected to the wiring layers 65 through the beam 47 and contact holes 72 are formed. The beam length of the beam 47 is selected in accordance with the resonance frequency.

Figure 14B:
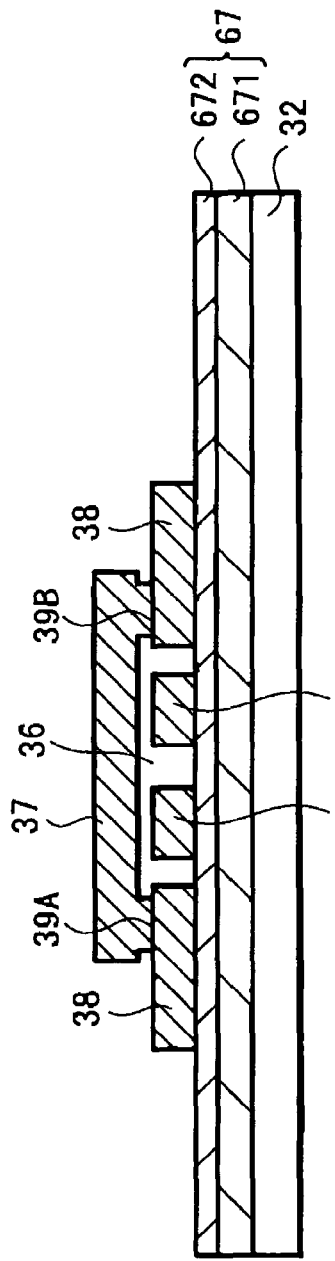

Next, as shown in FIG. 14B, the silicon oxide film of the sacrifice layer 71 is selectively removed by an etching solution for the sacrifice layer such as a DHF solution, a space 66 is formed between the beam 47 and the input electrode 45 and output electrode 46 of the lower electrodes.

Figure 14C:
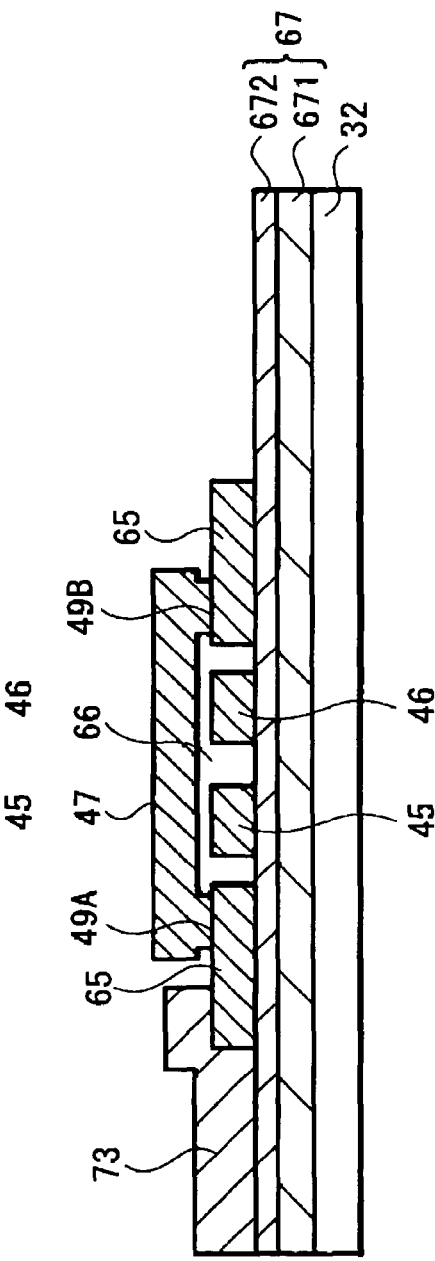

Next, as shown in FIG. 14C, after forming a conductive film, for example, a spatter film made of Al—Cu, Al—Si and the like, patterning is applied to the conductive film by the lithography technology and etching technology, and a wiring layer 79 having excellent conductivity is formed on the wiring layer 65. Further, though not shown in the figure, a conductive layer 73 to be a ground (GND) wiring is formed on the rear surface of the semiconductor substrate 32 through an insulation layer, if it is necessary. Thus, the oscillator elements 43, 44 are obtained.

In the other embodiments according to the present invention, a semiconductor device such as a signal filter, mixer, resonator, SiP (System in Package) device module that includes those, SoC (System on Chip) device module and the like can be formed using the above-described micro-oscillators 31, 41, 51, 61 and the like.

Since a semiconductor device according to the embodiments of the present invention includes a filter having excellent characteristics, the highly reliable semiconductor device can be provided.

The above-described micro-oscillators 31, 41, 51, 61 can be used as a band-pass filter such as a high frequency (RF) filter, an intermediate frequency (IF) filter and the like.

The present invention can provide a communication apparatus capable of communicating by using an electromagnetic wave, such as a mobile phone unit, radio LAN equipment, radio-trans/receiver, TV tuner, radio tuner, which use a filter including the above-described micro-oscillators according to the embodiments.

Figure 15:
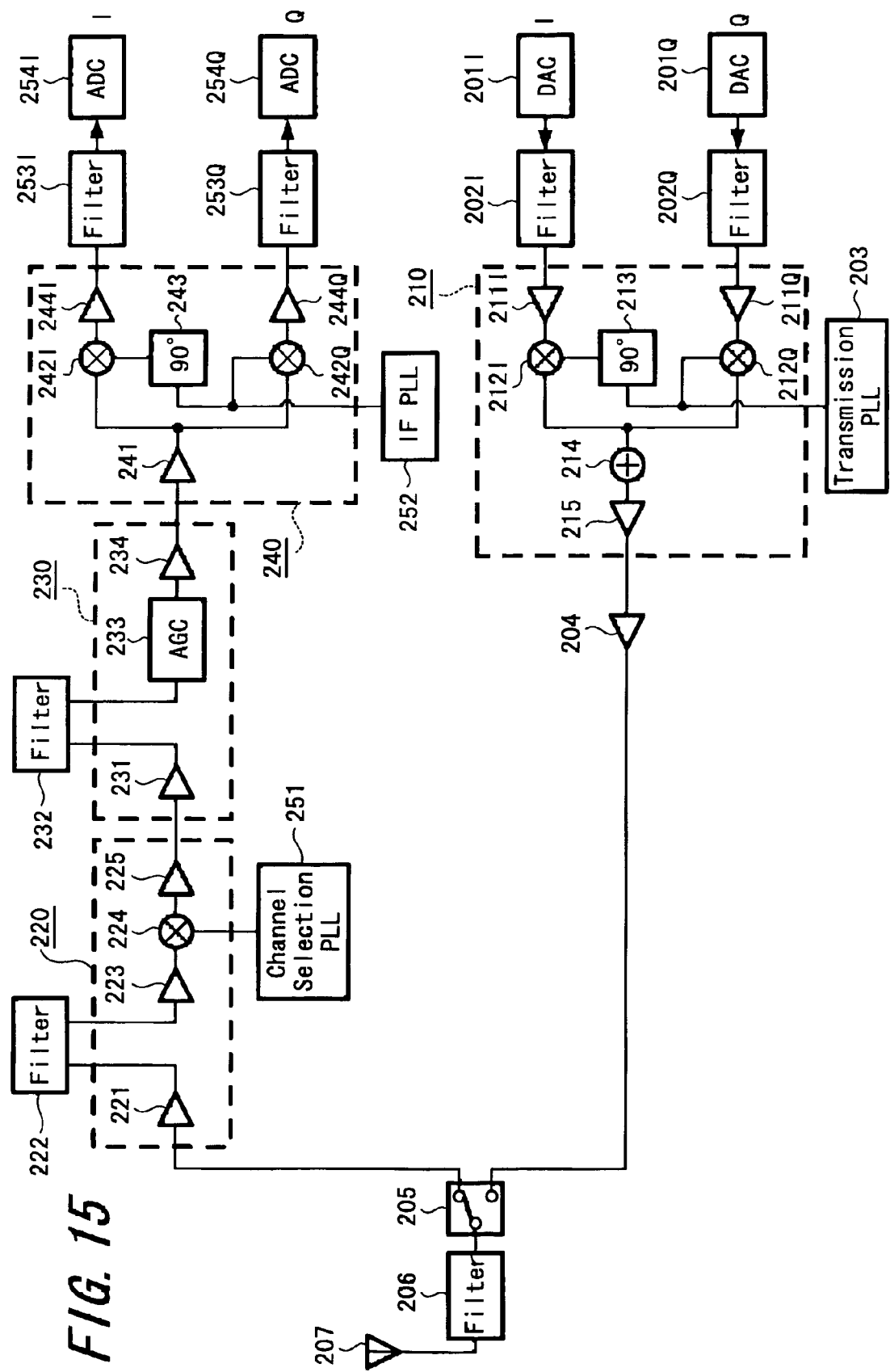
FIG. 15 is a circuit diagram showing an embodiment of a communication apparatus according to the present invention.

Next, an example of a configuration of a communication apparatus, to which a filter of the embodiments of the present invention described above is applied, is explained by referring to FIG. 15.

First, an explanation is made regarding a configuration of a transmission system, in which transmission data of I channel and transmission data of Q channel are respectively supplied to digital/analogue converters (DAC) 201I and 201Q to be converted into analogue signals. The converted signal of each channel is supplied to band-pass filters 202I and 202Q, and outputs of the band-pass filters 202I and 202Q are supplied to a modulator 210 after a signal component other than a transmission signal band is removed.

In the modulator 210, each channel signal is supplied to mixers 212I and 212Q through buffer amplifiers 211I and 211Q. This signal and a frequency signal corresponding to a frequency signal supplied from a transmission PLL (phase-locked loop) circuit 203 are mixed and modulated, and the mixed signal is added in an adder 214 to make a transmission signal of one system. In this case, with respect to the frequency signal supplied to the mixer 212I, a signal phase is shifted by 90° with a phase shifter 213 so that the signal of I channel and the signal of Q channel are orthogonally modulated.

An output of the adder 214 is supplied to a power amplifier 204 through a buffer amplifier 215, and is amplified to have a predetermined transmission power. The signal amplified in the power amplifier 204 is supplied to an antenna 207 through a transmission-reception switching unit 205 and high frequency filter 206, and is wirelessly transmitted from the antenna 207. The high frequency filter 206 is a band-pass filter that removes a signal component other than the frequency band to perform transmission and reception in this communication apparatus.

As a configuration of a reception system, a signal received by the antenna 207 is supplied to a high frequency portion 220 through the high frequency filter 206 and transmission-reception switching unit 205. In the high frequency portion 220, the received signal is amplified in a low noise amplifier (LNA) 221 and after that the signal is supplied to a band-pass filter 222 to remove a signal other than that in a reception frequency band, and the signal after the removal is supplied to a mixer 224 through a buffer amplifier 223. Further, a frequency signal supplied from a channel selection PLL circuit 251 is mixed to make a signal of a predetermined transmission channel into an intermediate frequency signal, and the intermediate frequency signal is supplied to an intermediate frequency circuit 230 through a buffer amplifier 225.

In the intermediate frequency circuit 230, the supplied intermediate frequency signal is supplied to a band-pass filter 232 through a buffer amplifier 231 to remove a signal component other than that in the band of the intermediate frequency signal, and the signal after the removal is supplied to an automatic gain control (AGC) circuit 233 and is made into a signal of an almost constant gain. The intermediate frequency signal whose gain is adjusted in the automatic gain control circuit 233 is supplied to a demodulator 240 through a buffer amplifier 234.

In the demodulator 240, the obtained intermediate frequency signal is supplied to mixers 242I and 242Q through a buffer amplifier 241 to mix a frequency signal supplied from an intermediate frequency PLL circuit 252 so that the received signal component of I channel and signal component of Q channel are demodulated. In this case, a frequency signal whose signal phase is shifted by 90° in a phase shifter 243 is supplied to the I signal mixer 242I to demodulate the orthogonally modulated signal component of I channel and signal component of Q channel.

The demodulated signals of I channel and Q channel are supplied respectively to band-pass filters 253I and 253Q through buffer amplifiers 244I and 244Q to remove a signal component other than the signals of I channel and Q channel, and the signals after the removal are supplied to analogue/digital converters (ADC) 254I and 254Q, and are sampled to be made into digital data, so that I channel reception data and Q channel reception data are obtained.

With respect to the configuration explained above, band-limiting can be performed by applying the filter of the above-described embodiments to part of or all of the band-pass filters 202I, 202Q, 206, 222, 232, 253I and 253Q.

According to the communication apparatus of the present invention, since the filter having less noise and excellent characteristics is used, a highly reliable communication apparatus can be provided.

Although each filter is configured as a band-pass filter in the example of FIG. 15, the filter is configured as a low pass filter that passes only a frequency band lower than a predetermined frequency and as a high pass filter that passes only a frequency band higher than a predetermined frequency, to which the filter having the above-described configuration of each embodiment is applied. In addition, the example of FIG. 15 is the communication apparatus that performs wireless transmission and wireless reception, however, the filter according to an embodiment of the present invention can be applied to a filter included in a communication apparatus that performs transmission and reception through a wired transmission path, and furthermore can be applied to a filter included in a communication apparatus that performs only transmission processing and in a communication apparatus that performs only reception processing.

It should be understood by those skilled in the art that various modifications, combinations, sub-combinations and alterations may occur depending on design requirements and other factors insofar as they are within the scope of the appended claims or the equivalents thereof.

What is claimed is:

1. A micro-oscillator, comprising:
   a plurality of beam-type first oscillator elements mutually connected in parallel;
   a plurality of beam-type second oscillator elements connected mutually in parallel; and
   a plurality of parallel elements connected to an output electrode arranged perpendicular to and transversally with respect to the plurality of beam-type first oscillator elements and the plurality of beam-type second oscillator elements,
   wherein,
   said first oscillator elements and said second oscillator elements are alternately arranged between each other,
   each of said plurality of beam-type first and second oscillator elements has a plurality of independent oscillation plates alternately arranged over the plurality of parallel elements with a space therebetween, and
   a DC bias voltage applied to each beam of said first and second oscillator elements is individually controlled.

2. The micro-oscillator according to claim 1, wherein said first oscillator elements adjacent to each other and said second oscillator elements adjacent to each other in the direction different from that of arranging said first and second oscillator elements are arranged such that phases of the oscillation become reverse to each other, respectively.

3. A semiconductor device, comprising: a micro-oscillator according to claim 1.

4. A communication apparatus including a filter that performs bandwidth limitation to a transmission signal and/or reception signal, comprising: a filter having a micro-oscillator according to claim 1 as said filter.

* * * * *